United States Patent
Saito et al.

(10) Patent No.: US 10,362,688 B2
(45) Date of Patent: Jul. 23, 2019

(54) ASSEMBLY STRUCTURE OF OPERATION UNIT

(71) Applicant: FUJITSU TEN LIMITED, Kobe-shi, Hyogo (JP)

(72) Inventors: Masatoshi Saito, Kobe (JP); Shinya Hachiue, Kobe (JP); Atsushi Baba, Kobe (JP); Ryosuke Sakai, Kobe (JP); Nobuyuki Ukai, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 0 days.

(21) Appl. No.: 15/621,694

(22) Filed: Jun. 13, 2017

(65) Prior Publication Data

US 2018/0027669 A1 Jan. 25, 2018

(30) Foreign Application Priority Data

Jul. 22, 2016 (JP) .................. 2016-144042

(51) Int. Cl.
*H05K 5/00* (2006.01)
*H05K 5/02* (2006.01)

(52) U.S. Cl.
CPC ......... *H05K 5/0013* (2013.01); *H05K 5/0017* (2013.01); *H05K 5/0204* (2013.01); *H05K 5/0217* (2013.01)

(58) Field of Classification Search
CPC ... H05K 5/0013; H05K 5/0017; H05K 5/0217
USPC ...................................... 361/807
See application file for complete search history.

(56) References Cited

U.S. PATENT DOCUMENTS

| 2002/0015021 A1* | 2/2002 | Numata | G05G 9/047 345/156 |
| 2003/0029709 A1* | 2/2003 | Serizawa | H01H 13/702 200/512 |
| 2003/0209418 A1* | 11/2003 | Yanai | H01H 13/44 200/406 |
| 2009/0323262 A1* | 12/2009 | Arita | G06F 1/1616 361/679.01 |
| 2010/0046179 A1* | 2/2010 | Arita | G06F 1/1616 361/752 |
| 2011/0267551 A1* | 11/2011 | Yokote | G06F 1/1643 348/836 |
| 2013/0141847 A1* | 6/2013 | Ryu | G06F 1/1616 361/679.01 |
| 2014/0098473 A1* | 4/2014 | Chen | H04M 1/0235 361/679.01 |

(Continued)

FOREIGN PATENT DOCUMENTS

| JP | H06-030098 A | 2/1994 |
| JP | H11-046071 A | 2/1999 |

(Continued)

*Primary Examiner* — Binh B Tran
*Assistant Examiner* — Douglas R Burtner
(74) *Attorney, Agent, or Firm* — Oliff PLC

(57) ABSTRACT

To provide an art of making a position of an operation section adjustable. An operation unit including an operation section, a supporter that supports the operation unit, and an elastic member that is held between the operation unit and the supporter are included, and the operation unit is brought into pressure contact with the supporter by an elastic force of the elastic member, and thereby the operation unit is slidably assembled to the supporter.

7 Claims, 8 Drawing Sheets

(56) References Cited

U.S. PATENT DOCUMENTS

| | | | |
|---|---|---|---|
| 2015/0124386 A1* | 5/2015 | Kitaura | H04M 1/0237 |
| | | | 361/679.3 |
| 2015/0212589 A1* | 7/2015 | Hatanaka | G06F 3/0414 |
| | | | 345/173 |
| 2017/0332499 A1* | 11/2017 | Senzaki | B60R 25/24 |

FOREIGN PATENT DOCUMENTS

| | | |
|---|---|---|
| JP | 2002-287840 A | 10/2002 |
| JP | 2013-004237 A | 1/2013 |

\* cited by examiner

ASSEMBLY STRUCTURE OF OPERATION UNIT

CROSS-REFERENCE TO RELATED APPLICATION

The present application claims priority to Japanese Patent Application No. 2016-144042, filed Jul. 22, 2016, the entire contents of which are incorporated herein by reference.

FIELD

The invention relates to an assembly structure of an operation section.

BACKGROUND

As operation sections for users to operate electronic equipment, there are known various operation sections such as a push button switch, a seesaw switch, a lever, and a volume (a variable resistor). For example, in the case of a push button switch, the operation section is equipped with a button section that is operated by a user, and a mechanism section that performs opening and closing a contact by a pushing action (operation) by the user.

In electronic equipment that is equipped with an operation section like this, a cover is often put on a substrate and a mechanism section to protect the substrate and the mechanism section of the push button switch, or to enhance beauty, and a portion (hereunder, also referred to as a portion to be operated) that is operated by a user in the push button switch is formed to be exposed from an opening that is provided in the cover.

[Patent document 1] Japanese Patent Laid-Open No. 2013-4237

[Patent document 2] Japanese Patent Laid-Open No. 06-30098

SUMMARY

When the portion to be operated of the operation section is formed to be exposed from the opening of the cover as described above, the position of the opening of the cover and the position of the portion to be operated of the operation section need to correspond to each other, and high positional precision is demanded. Here, when mounting of the operation section to the electronic equipment and mounting of the cover are performed in an integrated manner, adjustment and the like for ensuring positional presion, such as adjustment of the mounting position of the operation section corresponding to the position of the opening of the cover are easily performed. However, when a manufacturer that mounts the operation section to the electronic equipment, and a manufacturer that mounts the cover to the electronic equipment differ, there arises the problem that positional precision is difficult to obtain.

For example, when the electronic equipment is an audio or a navigation device that is mounted on a vehicle, the manufacturer that produces the electronic equipment often produces electronic equipment in a state without a cover to ship the electronic equipment to a vehicle manufacturer, and the vehicle manufacturer installs the electronic equipment in the vehicle and fits the cover. In this case, the electronic equipment and the cover are assembled separately, so that the positional precision of the operation section of the electronic equipment and the opening of the cover is difficult to ensure.

When the positional precision is not able to be ensured, a clearance (a space) between the operation section and the opening portion of the cover needs to be set to be large, but when the space is large, there arises the problem of impairing the beauty of the product. Especially when the space around a button or a knob is uneven in vertical and lateral directions (that is, the center of the button or the knob, and the center of the opening of the cover deviate from each other), an adverse effect on the beauty is remarkable.

Thus, an object of the invention is to provide an art of making the position of the operation section adjustable.

In order to solve the aforementioned problem, an assembly structure of the invention includes an operation unit including an operation section, a supporter that supports the operation unit, and an elastic member that is held between the operation unit and the supporter, wherein the operation unit is brought into pressure contact with the supporter by an elastic force of the elastic member, and thereby the operation unit is slidably assembled to the supporter.

According to the structure, the position of the operation unit can be adjusted, and assembly of the cover becomes easy. For example, when the cover is mounted so as to allow a part of the operation section in the opening of the cover to pass through, the position of the operation unit can be adjusted in accordance with the position of the opening even when the positional precision, of the opening is low, and therefore, the cover can be easily mounted.

Effects of the Invention

According to the invention, the art of making the position of the operation section adjustable can be provided.

DESCRIPTION OF EMBODIMENTS

Hereunder, embodiments of the invention will be described with reference to the drawings. Structures of the following embodiments are illustrations, and the invention is not limited to the structures of the embodiments.

Embodiment 1

<<Entire Structure>>

Figure 1:
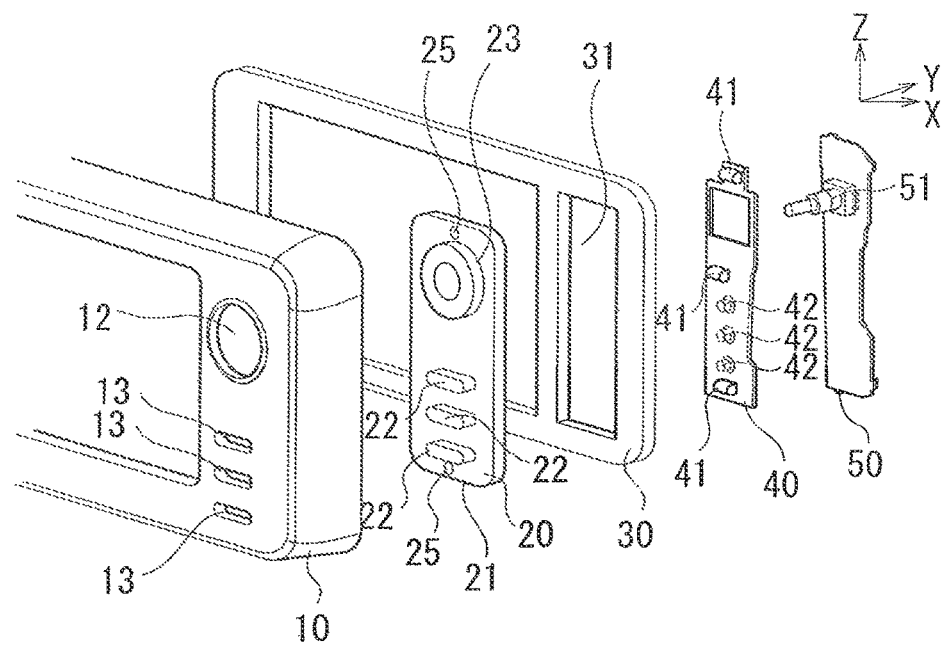
FIG. 1 is an exploded perspective view of an assembly structure of an operation unit seen from a diagonally front side.
Figure 2:
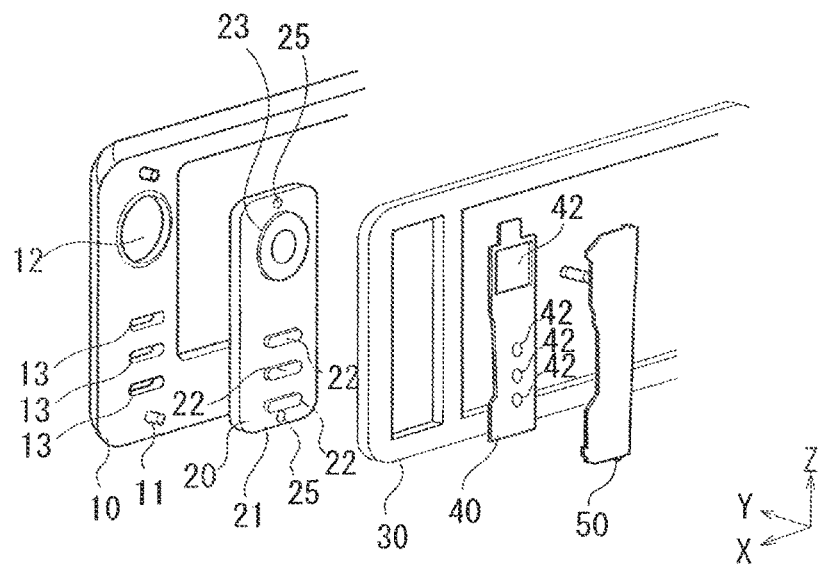
FIG. 2 is an exploded perspective view of the assembly structure of the operation unit seen from a diagonally rear side.
Figure 3:
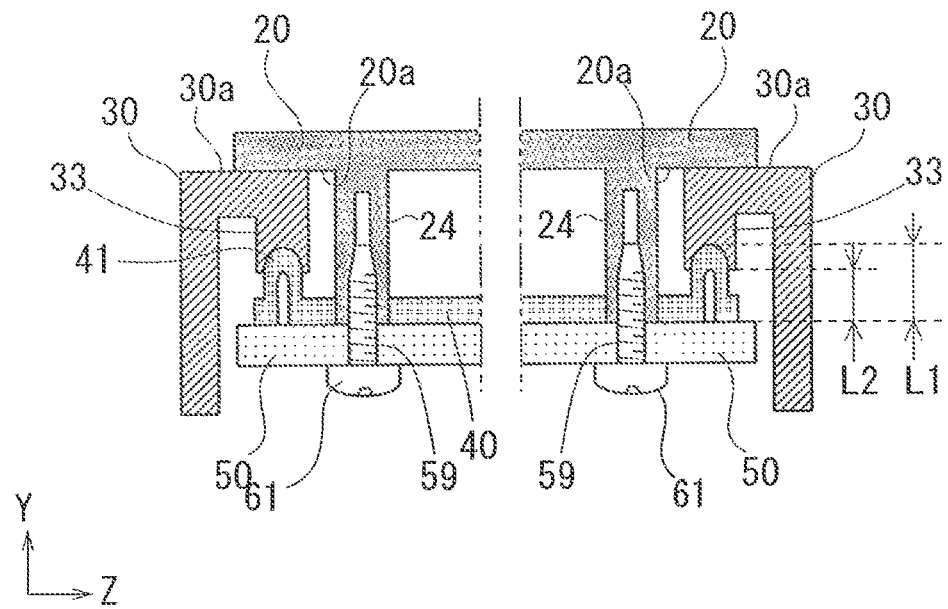
FIG. 3 is a view illustrating an assembly structure of an operation section.
Figure 4:
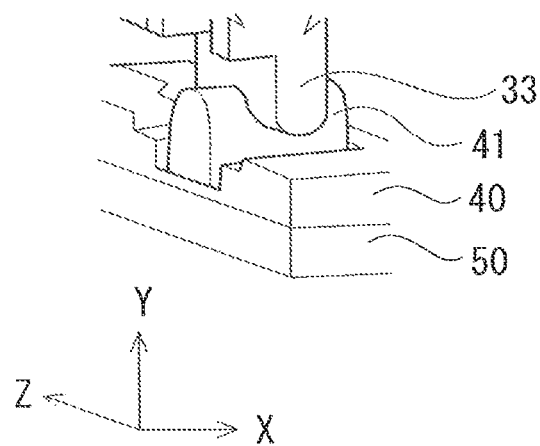
FIG. 4 is a view illustrating an abutment portion of an elastic member and a panel frame.
Figure 5A:
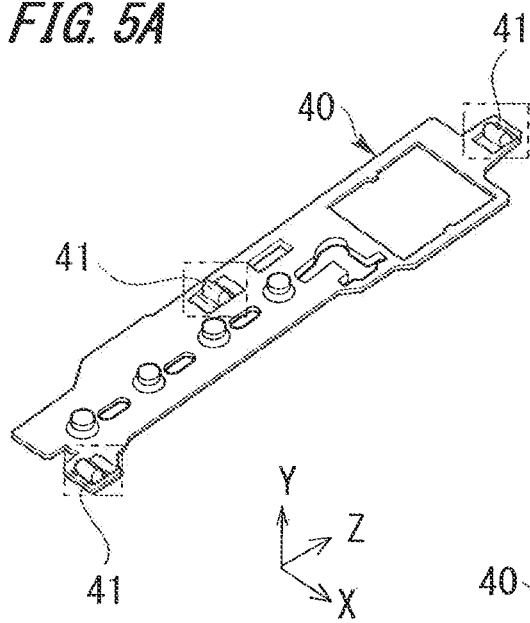
FIGS. 5A and 5B are views illustrating a structure of an elastic sheet member.
Figure 5B:
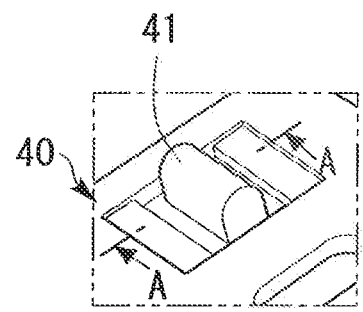
Figure 6:
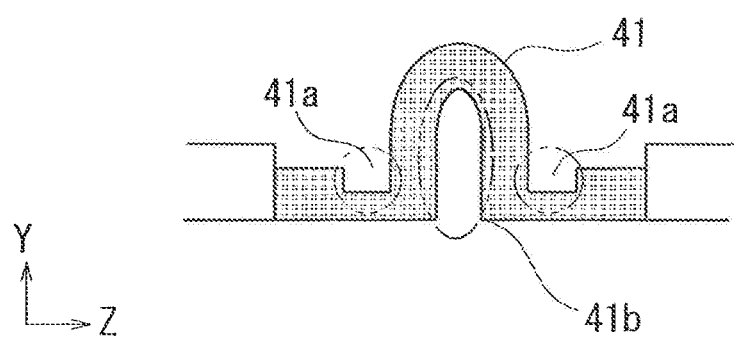
FIG. 6 is a view illustrating a protruded portion of the elastic sheet member.

FIG. 1 is an exploded perspective view of an assembly structure of an operation unit seen from a diagonally front side, FIG. 2 is an exploded perspective view of the assembly structure of an operation unit seen from a diagonally rear side, FIG. 3 is a view illustrating an assembly structure of an operation section, FIG. 4 is a view illustrating an abutment portion of an elastic member and a panel frame, FIGS. 5A and 5B are views illustrating a structure of an elastic sheet member, and FIG. 6 is a view illustrating a protruded portion of the elastic sheet member. Note that in the following explanation, an Y-axis direction corresponds to a fore-and-aft direction of electronic equipment, a side where a cover 10 is mounted is a front, and an opposite side from the cover 10 is a rear. Further, an X-axis direction corresponds to a lateral direction or the electronic equipment, and a Z-axis direction corresponds to a vertical direction of the electronic equipment. These directions are examples, and the invention is not limited to the directions.

As illustrated in FIG. 1 and FIG. 2, an assembly structure of the example includes a button holder 20, a panel frame 30, an elastic sheet member 40 and a substrate 50, and the cover 10 is mounted to the panel frame 30. Of them, the button holder 20, the elastic sheet member 40 and the substrate 50 form an operation unit 60.

The button holder 20 is a member that holds a member to be operated that is operated by a user, such as an operation button, to allow movement by the operation. For example, in the button holder 20, a plurality of pressing operation sections (members to be operated) 22 are held by a plate-shaped holder section 21 to be able to advance and retract in the fore-and-aft direction (the Y-axis direction). Further, in the button holder 20, a disk-shaped turning operation section (a member to be operated) 23 is held by the holder section 21 to be turnable with the Y-axis direction as an axis. The button holder 20 is one mode of a front member that is disposed on a front surface side of the panel frame 30.

The panel frame 30 is a supporter that is fixed to a front part of the electronic equipment and supports the operation unit 60.

In the sheet member 40, dome-shaped contact sections 42 that switch electrical connection or non-connection among a plurality of contacts are formed. Further, in the elastic sheet member 40, protruded portions 41 are formed by raising parts of the elastic sheet member 40.

In the substrate 50, elements forming the operation section, and circuit patterns (not illustrated) such as a plurality of contacts are formed. The substrate 50 is one mode of a rear member that is fixed to the button holder 20 with the panel frame 30 therebetween, and is disposed on a back surface side of the panel frame 30.

<<Assembly>>

Next, with use of FIG. 3, assembly of the operation unit 60 to the panel frame 30 will be described. Note that FIG. 3 mainly illustrates peripheries of the protruded portions (elastic members) 41 that are held between the operation unit 60 and the panel frame 30, and a middle part of the assembly is omitted.

The button holder 20 closes an opening 31 provided in a predetermined mounting position of the panel frame 30 from the front surface side, and is disposed so that an edge of a back surface 20a of the button holder 20 contacts a front surface 30a of the panel frame 30. At this time, screw receiving portions 24 that are vertically provided on the back surface 20a of the button holder 20 protrude to a rear side via the opening 31 of the panel frame 30.

Subsequently, the substrate 50 is disposed on the back surface side of the panel frame 30 in a state in which the elastic sheet member 40 is laid on a front surface of the substrate 50, and screws 61 are screwed onto the screw receiving portions 24 via screw holes 59, whereby the substrate 50 is fixed to the button holder 20 substantially parallel with the button holder 20, with a predetermined distance left with respect to the button holder 20.

At this time, the protruded portions (the elastic members) 41 that are provided on the front surface of the elastic sheet member 40 are held between the substrate 50 and the and frame 30. Specifically, as illustrated in FIG. 3 and FIG. 4, a rib 33 that is protruded to a substrate 50 side is provided on the back surface of the panel frame 30, and the protruded portion 41 is held between a rear surface of the rib 33 and the front surface of the substrate 50.

In the protruded portion 41, a length L1 in the fore-and-aft direction (the Y-axis direction) is formed to be longer than a space L2 between the front surface of the substrate 50 and a rear end of the rib 33, so that the protruded portion 41 is held in a state in which the protruded portion 41 is pressed and contracted between the substrate 50 and the rib 33, and the back surface of the button holder 20 is brought into pressure contact with the front surface of the panel frame 30 by an elastic force of the protruded portion 41.

In this way, the operation unit 60 is not fixed by a screw or the like, but is held by a pressure contact force to the panel frame 30, so that when a force in a direction along a pressure contact surface with the panel frame 30, that is, in a direction within an X-Z plane in the embodiment is applied to the operation unit 60, the operation unit 60 slides along the pressure contact surface with the panel frame 30. That is, position adjustment in a direction (a two-dimensional direction) along the X-Z plane is possible.

Further, the rib 33 is formed to be lengthwise in a direction along the back surface of the panel frame 30, in the Z-axis direction in an example in FIG. 4, the protruded portion 41 of the elastic sheet member 40 is formed to be lengthwise in the direction along the back surface of the panel frame 30, in the X-axis direction in the example in FIG. 4, and the protruded portion 41 and the rib 33 are disposed to abut on each other so that a lengthwise direction of the protruded portion 41 and a lengthwise direction of the rib 33 are orthogonal to each other.

In this way, in the embodiment, a structure in which the protruded portion 41 and the rib 33 abut on each other is adopted, but the rib 33 is not an indispensable component, and a structure in which the protruded portion 41 abuts on the back surface of the frame 30 may be adopted by omitting the rib 33. However, when the structure in which the protruded portion 41 abuts on the back surface of the panel frame 30 instead of the rib 33 is adopted, a contact area of the protruded portion 41 and the panel frame 30 becomes large, and resistance at a sliding time increases. In contrast with this, in the structure in which the protruded portion 41 and the rib 33 abut on each other so that the lengthwise direction of the protruded portion 41 and the lengthwise direction of the rib 33 are orthogonal to each other, the protruded portion 41 and the rib 33 abut on each other in a point shape in a limited area where the protruded portion 41 and the rib 33 cross each other, so that resistance at the sliding time decreases, and position adjustment of the operation unit 60 can be easily made.

The button holder 20, the elastic sheet member 40 and the substrate 50 are assembled as described above, whereby a plurality of terminals (not illustrated) that are formed on the front surface of the substrate 50, the contact sections 42 of the elastic sheet member 40, and the pressing operation sections 22 are disposed by being aligned on the Y-axis. Consequently, when the pressing operation section 22 is pushed to the rear side by a user, a rear end of the pressing operation section 22 crushes the dome-shaped contact section 42, and a conduction section (not illustrated) that is formed in the dome of the contact section 42 contacts a plurality of terminals on the substrate 50 to electrically connect the plurality of terminals. Further, when the user stops pressing, and the pressing operation section 22 is returned to a front side, the conduction section of the contact section 42 separates from the plurality of terminals, and the terminals are not electrically connected. That is, the pressing operation sections 22, the contact sections 42, the terminals on the substrate 50 in the operation unit 60 form the pressing button switch (the operation section).

Further, an element 51 that generates an electrical signal corresponding to a turning operation is provided on the substrate 50, and in a state in which the operation unit 60 is assembled, a front end of a turning shaft 51a is fitted in a fitting recessed portion (FIG. 2) 23a that is provided on a back surface of the turning operation section 23. Consequently, when the turning operation section 23 is rotationally operated by the user, the element 51 generates an electrical signal corresponding to the turning operation. That is, the rotation operation section 23 and the element 51 form the operation section. The element 51 is a variable resistor or a rotary encoder, for example. The turning operation section 23 is used as a sound intensity (volume) adjustment knob of music, or used as a tuning dial of a radio or the like, for example, by a turning operation by the user.

Subsequently, the cover 10 is mounted to a front side of the panel frame 30 in the state in which the operation unit 60 is assembled to the panel frame 30. At this time, the pressing operation sections 22 and the turning operation section 23 are inserted through openings 12 and 13 that are provided in the cover 10, and portions to be operated that are operated by the user are exposed forward. At this time, an engaging protruded portion 11 that is protruded rearward from a back surface of the cover 10 is fitted in a hole 25 that is provided in the holder section 21, whereby the operation unit 60 is positioned to the cover 10. That is, the operation unit 60 is slidably mounted to the panel frame, so that an assembly error of the cover 10 and the panel frame 30 is absorbed by the slide, and it becomes possible to position the pressing operation sections 22 and the turning operation section 23 to the openings 12 and 13 that are provided on the cover 10 by merely positioning by the engaging protruded portion 11 on the cover 10 and the hole 25 provided in the holder section 21.

<<Shape of Elastic Member>>

Next, with use of FIG. 5A to FIG. 8, a shape of the protruded portion 41 will be described in detail. The protruded portion 41 is provided by raising a plane portion that is a base portion of the dome-shaped contact section 42 to the front side, in the elastic sheet member 40. The number of protruded portions 41 is not specially limited, but a plurality of protruded portions 41 are desirably provided. In an example in FIG. 5A, a plurality (three) of protruded portions 41 are provided on an outer side from the contact sections 42 forming the operation section and an opening 49 in which the element 51 forming the operation section is located.

Figure 7:
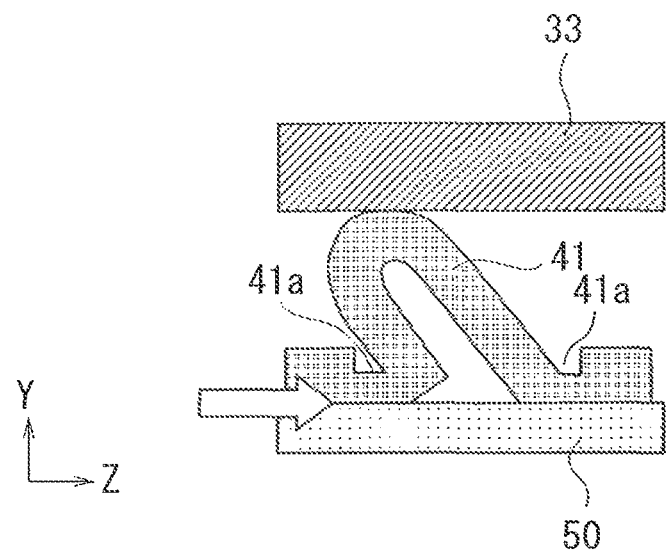
FIG. 7 is a view illustrating a state of the protruded portion at a time of position adjustment.

FIG. 5B is a view illustrating a vicinity of the protruded portion 41 in FIG. 5A by enlarging the vicinity of the protruded portion 41, and FIG. 6 is a sectional view along line A-A in FIG. 5B. As illustrated in FIG. 5B and FIG. 6, in a position adjacent to the protruded portion 41 in a direction (the Z-axis direction) orthogonal to a lengthwise direction (the X-axis direction) of the protruded portion 41, in the X-Z plane, recessed portions 41a are provided in groove shapes along the lengthwise direction of the protruded portion 41. This is because a front end of the protruded portion 41 tilts to a rear side in a moving direction by a frictional force with the rib 33 when the operation unit 60 is moved in the Z-axis direction as illustrated in FIG. 7, and therefore, the protruded portion 41 is enabled to tilt naturally by providing the recessed portions 41a and using the recessed portions 41a as an escape when tilting.

Figure 8:
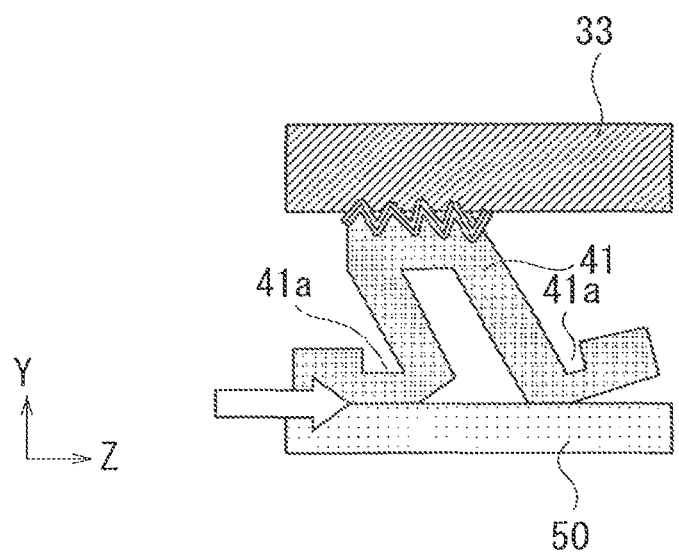
FIG. 8 is a view illustrating a state of a protruded portion at a time of position adjustment in a comparative example.

Further, in the protruded portion 41, an abutment surface onto the panel frame 30, that is, an abutment surface onto the rib 33 is formed of a curved surface that is protruded toward the panel frame 30. Thereby, as illustrated in FIG. 8, for example, contact resistance with the panel frame 30 can be decreased, and position adjustment can be easily performed, as compared with a case in which the abutment surface of the protruded portion 41 onto the panel frame 30 is made a flat surface. Note that in the embodiment, an undersurface of the rib 33, which is an abutment surface on the panel frame side is also made a curved surface that is protruded toward a protruded portion 41 side, and contact resistance is further decreased.

Further, as illustrated in FIG. 6, the protruded portion 41 has a hollow portion 41b in the protruded portion 41, and is set to have a proper elastic force. For example, an elastic force becomes lower as a ratio of the hollow portion 41b in the protruded portion 41 is larger, and the elastic force becomes higher as the ratio of the hollow portion 41b in the protruded portion 41 is smaller. Note that when a high elastic force is needed, the protruded portion 41 may be formed to be solid without providing the hollow portion 41b.

Effect of Embodiment

As above, in embodiment 1, the operation unit 60 including the operation section, the panel frame (supporter) 30 that supports the operation unit 60, and the protruded portions (elastic members) 41 that are held between the operation unit and the supporter are included, and the button holder 20 of the operation unit 60 is brought into pressure contact with the panel frame 30 by the elastic forces of the protruded portions 41, whereby the operation unit 60 is slidably assembled to the panel frame 30.

Owing to the structure, in the case of mounting the cover 10, the position of the operation unit 60 to the cover 10 can be adjusted, and assembly of the cover 10 becomes easy. Specifically, even when positional precision of the openings 12 and 13 of the cover 10 through which the portion to be operated of the operation section passes is low, the positions of the openings 12 and 13 and the position of the portion to be operated of the operation unit 60 can be adjusted.

Figure 9:
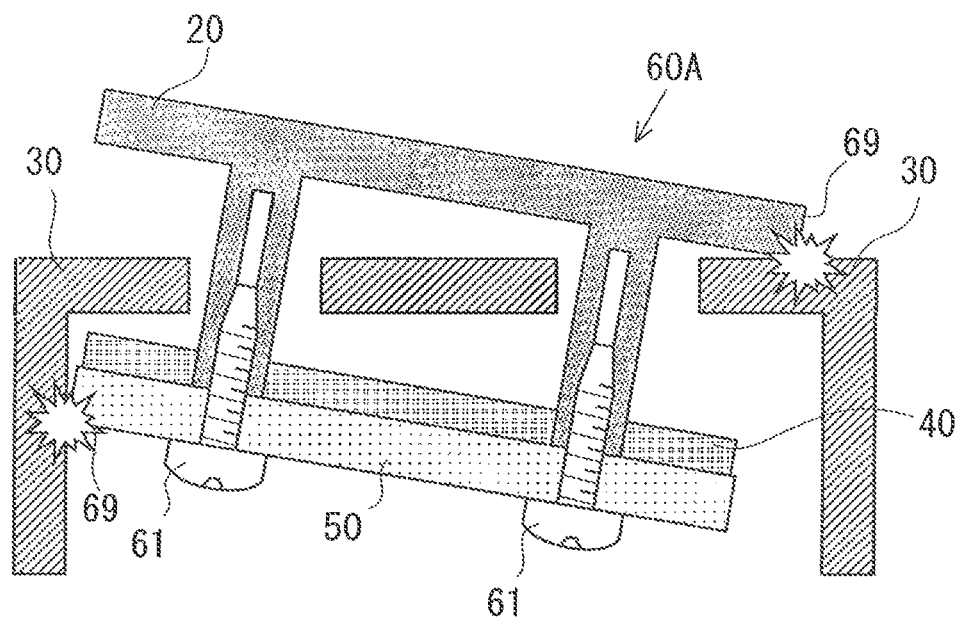
FIG. 9 is a view illustrating occurrence of collision in the comparative example.
Figure 9:
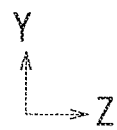

Note that it is conceivable to enable the operation unit 60 to move freely in a space from the panel frame 30 by omitting the protruded portions 41 from the operation unit 60, instead of sliding the operation unit 60 while pressing the operation unit 60 to the panel frame 30, but in this case, it is conceivable that an end portion 69 of an operation unit 60A where the protruded portions 41 are omitted collides with the panel frame 30 or the like broken, and collision sound (noise) occurs, as illustrated in FIG. 9. Especially in the case of electronic equipment mounted on a vehicle, noise occurs by vibration during traveling.

Contrary to the above, in the assembly structure of the embodiment, the button holder 20 of the operation unit 60 is brought into pressure contact with the panel frame 30 by the elastic forces of the protruded portions 41, and the operation unit 60 is held in the specific position, so that breakage by collision and occurrence of noise at the time of traveling of the vehicle can be prevented.

Further, the operation unit 60 includes the button holder (front member) 20 that is disposed on the front surface side of the panel frame 30, and the substrate (rear member) 50 that is disposed on the back surface side of the panel frame 30, and the protruded portions 41 are held between the panel frame 30 and the substrate 50.

Thereby the back surface of the button holder 20 slides along the front surface of the panel frame 30 to enable position adjustment of the operation unit 60.

Further, in the embodiment, the operation unit 60 is provided with the elastic sheet member 40 in which the contact sections 42 that switch electrical connection or non-connection among the plurality of contacts are formed, and the protruded portions (elastic members) 41 are provided by raising parts of the elastic sheet member 40.

In this way, by using the parts of the elastic sheet member 40 forming the operation section as the elastic members, the structure that brings the operation unit 60 into pressure contact with the panel frame 30 can be taken without adding a new component. That is, the operation unit 60 can be slidably assembled to the panel frame 30 with the simple structure.

In the embodiment, the abutment surfaces in the protruded portions 41 onto the panel frame 30 are formed to be the curved surfaces that are protruded toward the panel frame 30.

Thereby, the contact resistance of the protruded portions 41 with the panel frame 30 can be decreased, and position adjustment can be easily performed.

In the embodiment, the protruded portion 41 is a ridge which is lengthwise in the direction (the X-axis direction) along the abutment surface onto the panel frame 30, the panel frame 30 includes the rib 33 that protrudes to the substrate 50 from the surface on the substrate 50 side, and is lengthwise in the direction (the Z-axis direction) along the surface on the substrate 50 side, and is disposed with the protruded portion 41 and the rib 33 abutting on each other so that the lengthwise direction of the protruded portion 41 and the lengthwise direction of the rib 33 are orthogonal to each other.

Thereby, the protruded portion 41 and the rib 33 abut on each other in a point shape in a limited area where the protruded portion 41 and the rib 33 cross each other, so that the resistance at a sliding time is decreased, position adjustment of the operation unit 60 is easy, and the operation unit 60 can be smoothly slid in all directions.

In the embodiment, the recessed portions 41a are provided in the positions adjacent to the protruded portion 41 of the elastic sheet member 40. Thereby, when the operation unit 60 is moved, and the front end of the protruded portion 41 tilts to the rear side in the moving direction by the frictional force with the rib 33, the recessed portions 41a are used as an escape at a tilting time, whereby the protruded portion 41 can be tilted naturally. Consequently, position adjustment of the operation unit 60 can be performed smoothly.

Modified Example 1

Embodiment 1 has the structure in which the protruded portions (the elastic members) 41 are held between the operation unit 60 and the panel frame 30, and the protruded portions 41 slide with respect to the panel frame 30 with movement of the operation unit 60, but the invention is not limited to the structure. The modified example 1 illustrates an example in which an abutment portion of the protruded portion 41 onto the panel frame 30 is fixed to the panel frame 30. The other structure is the same as in embodiment 1, and therefore redundant explanation will be omitted by assigning the same elements with the same reference numerals and symbols.

Figure 10A:
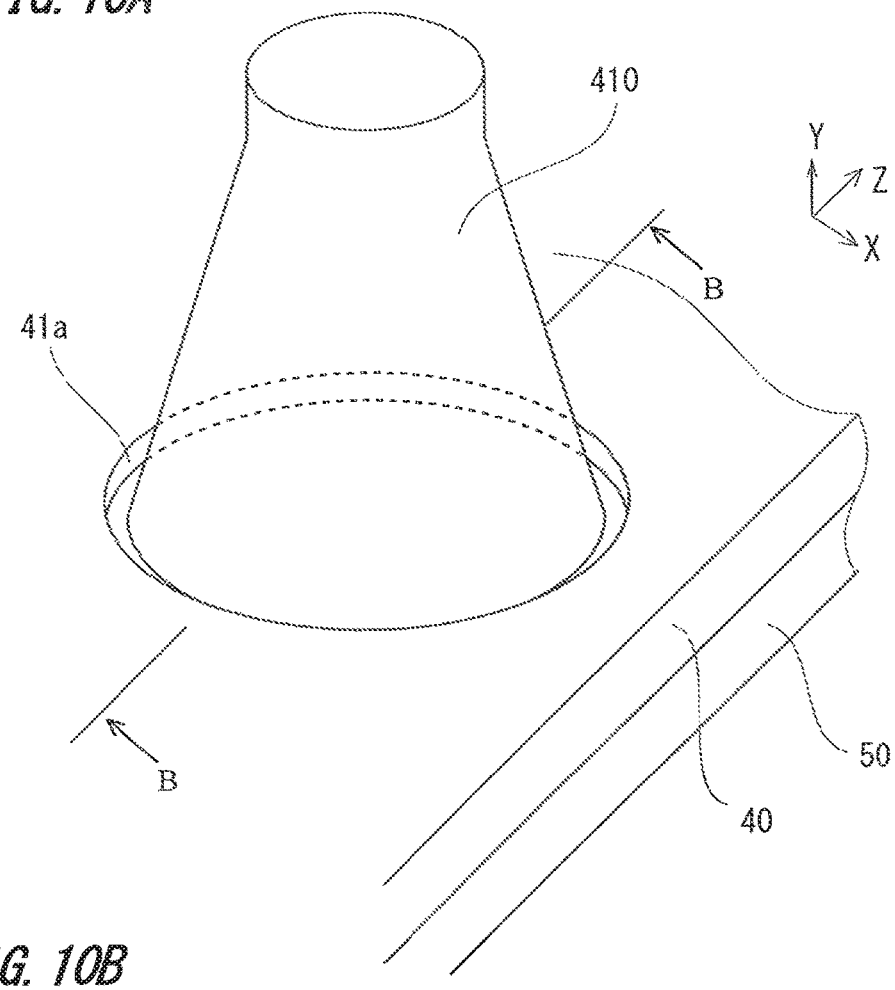
FIGS. 10A and 10B are views illustrating a periphery of a protruded portion in modified example 1.
Figure 10B:
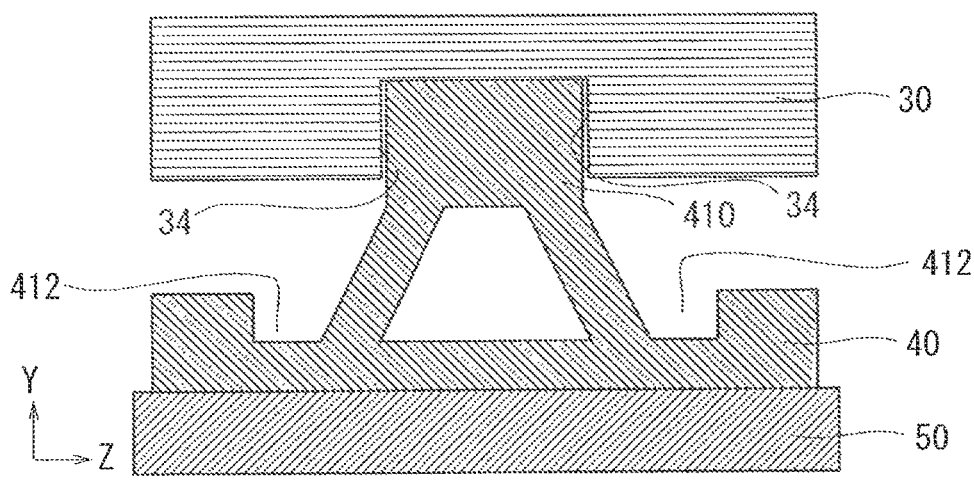

FIGS. 10A and 10B are views illustrating a structure in a vicinity of a protruded portion 41A of modified example 1, FIG. 10A illustrates a perspective view, and FIG. 10B illustrates a sectional view along line B-B. In the modified example 1, a fitting recessed portion 34 that is fitted onto a protruded portion 410 is provided on the back surface of the panel frame 30. Further, the protruded portion 410 is formed in a dome shape by raising a part of the elastic sheet member 40.

Subsequently, when the operation unit 60 is assembled to the panel frame 30, a tip end of the protruded portion 410 is fitted in the fitting recessed portion 34. The protruded portion 410 is held between the operation unit 60 and the panel frame 30 as in embodiment 1, and brings the operation unit 60 into pressure contact with the panel frame 30 by an elastic force.

When a force in a direction in the X-Z plane is applied to the operation unit 60, the protruded portion 410 bends, whereby the operation unit 60 slides along a pressure contact surface with the panel frame 30. That is, position adjustment in the direction (the two-dimensional direction) along the X-Z plane is made possible.

In this way, in the modified example 1, the fitting recessed portion 34 in which the protruded portion 410 is fitted is provided in the position of the panel frame 30 where the panel frame 30 holds the protruded portion 410. Thereby, the abutment position of the panel frame 30 and the protruded portion 410 can be accurately positioned, a center of position adjustment is accurately determined, and position adjustment can be performed in a uniform range with respect to the center.

Modified Example 2

Modified example 1 has the structure in which positioning of the protruded portion 410 is performed by providing the fitting recessed portion 34 on the back surface of the panel frame 30, but the invention is not limited to the structure, and the modified example 2 illustrates an example of performing positioning of a protruded portion (an elastic member) by providing a protruded portion on the back surface of the panel frame 30. The other structure is the same as in modified example 1, and redundant explanation will be omitted by assigning the same elements with the same reference numerals and symbols.

Figure 11:
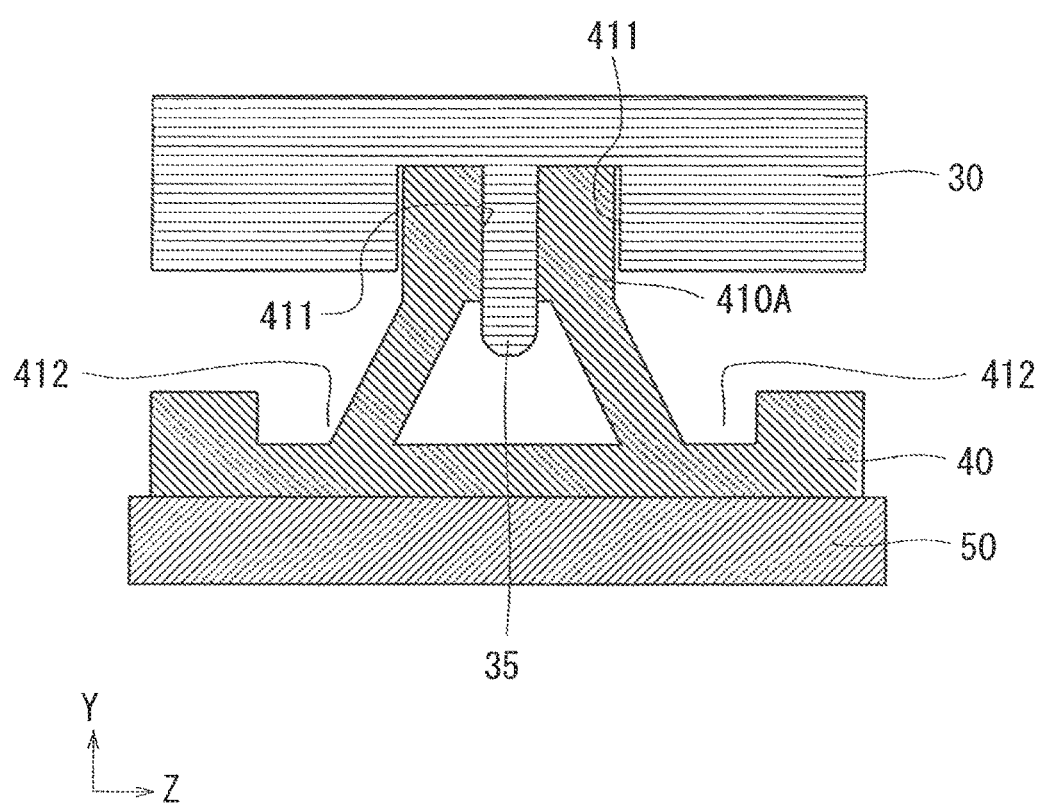
FIG. 11 is a view illustrating a periphery of a protruded portion in modified example 2.

FIG. 11 is a view illustrating a structure in a vicinity of a protruded portion 410A of modified example 2. In the modified example 2, a protruded portion 35 that is fitted in the protruded portion 410A is provided on the back surface of the panel frame 30. Further, the protruded portion 410A is formed into a dome shape by raising a part of the elastic sheet member 40 as in modified example 1, and has a hole 411 in which the protruded portion 35 is fitted provided in a front end.

When the operation unit 60 is assembled to the panel frame 30, the protruded portion 35 is fitted in the hole 411 of the protruded portion 410A. Thereby, the protruded portion 410A is positioned to the panel frame 30 as in modified example 1.

In this way, in the modified example 2, the protruded portion 35 is provided in a position of the panel frame 30 where the panel frame 30 holds the protruded portion 410A. Thereby, an abutment position of the panel frame 30 and the protruded portion 410A can be accurately positioned, the center of position adjustment is accurately determined, and position adjustment can be performed in a uniform range with respect to the center.

Embodiment 2

In embodiment 1, parts (the protruded portions) of the elastic sheet member 40 are used as the elastic members, but the invention is not limited to this, the embodiment 2 illustrates an example in which an independent elastic member is held between the operation unit 60 and the panel frame 30 without including the elastic sheet member. Note that the other structure is the same as in embodiment 1, and therefore redundant explanation will be omitted by assigning the same elements with the same reference numerals and symbols.

Figure 12A:
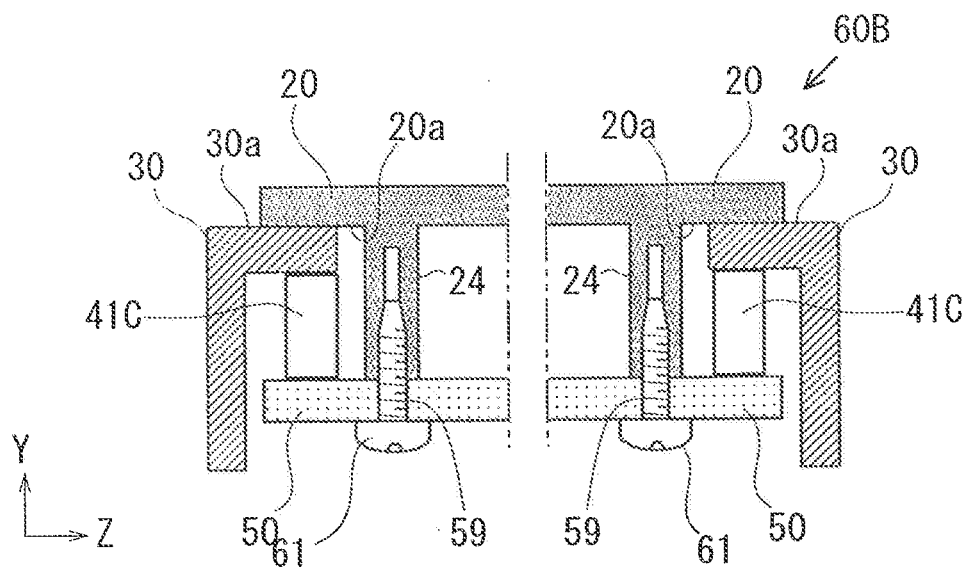
FIGS. 12A and 12B are views illustrating an assembly structure of an operation unit according to embodiment 2.
Figure 12B:
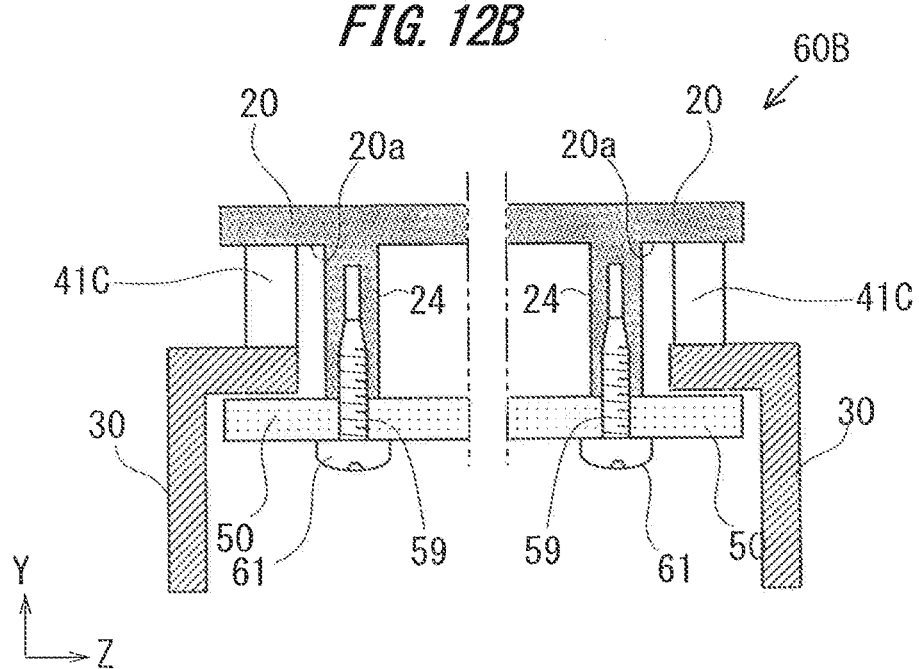

FIGS. 12A and 12B are views illustrating an assembly structure of an operation unit according to the embodiment 2. As illustrated in FIG. 12A, an operation unit 60B of the embodiment 2 holds rubber blocks 41C as elastic members between the panel frame 30 and the substrate 50. The rubber blocks 41C are held in a compressed state, and bring the back surface of the button holder 20 in the operation unit 60B into pressure contact with the front surface of the panel frame 30 by an elastic force.

In this way, the assembly structure of the embodiment can hold the operation unit 60B slidably with respect to the panel frame 30, by holding the rubber blocks 41C between the operation unit 60B and the panel frame 30 even with the structure having no elastic sheet member.

Note that the elastic member may be a member using another elastic material such as a spring without being limited to the rubber block 41C.

Further, as illustrated in FIG. 12B, the assembly structure of the embodiment may be a structure in which the elastic member 410 is held between the panel frame 30 and the button holder 20, and the front surface of the substrate 50 is brought into pressure contact with the back surface of the panel frame 30. In this case, the substrate 50 is slid along the panel frame 30, and thereby the position of the operation unit 60 can be adjusted.

Although the embodiments of the invention are described above, the embodiments are merely illustrations, the invention is not limited to these embodiments, and various changes based on the knowledge of a person skilled in the art can be made as long as the changes do not depart from the gist of the Scope of Claims.

What is claimed is:

1. An assembly structure of an operation unit, comprising:
an operation unit including an operation section;
a supporter that supports the operation unit;
an elastic member that is held between the operation unit and the supporter; and
a cover disposed on a front surface side of the operation unit and attached to the supporter, the cover having an opening for allowing the operation section of the operation unit to be exposed on a front surface of the assembly structure,
wherein the operation unit comprises
a front member that is disposed on a front surface side of the supporter, and
a rear member that is disposed on a back surface side of the supporter,
the front member and the rear member being fixed to each other with a predetermined distance between the front member and the rear member,
the elastic member is held between the supporter and the rear member, or between the front member and the support,
wherein the operation unit is brought into pressure contact with the supporter by an elastic force of the elastic member, and thereby the operation unit is slidably assembled to the supporter, and
wherein the operation section of the operation unit is positioned with respect to the opening of the cover by sliding of the operation unit to the supporter.

2. An assembly structure of an operation unit, comprising:
an operation unit including an operation section;
a supporter that supports the operation unit; and
an elastic member that is held between the operation unit and the supporter,
wherein the operation unit comprises
a front member that is disposed on a front surface side of the supporter, and
a rear member that is disposed on a back surface side of the supporter,
the front member and the rear member being fixed to each other with a predetermined distance between the front member and the rear member, and
the elastic member being held between the supporter and the rear member, or between the front member and the support, and
wherein the operation unit is brought into pressure contact with the supporter by an elastic force of the elastic member, and thereby the operation unit is slidably assembled to the supporter,
wherein the operation unit is provided with an elastic sheet member in which contact sections that switch electrical connection or non-connection among a plurality of contacts are formed, and
the elastic member is a protruded portion that is provided by raising a part of the elastic sheet member.

3. The assembly structure of an operation unit according to claim 2,
wherein an abutment surface onto the supporter, in the protruded portion is a curved surface that is protruded toward the supporter.

4. The assembly structure of an operation unit according to claim 2,
wherein the protruded portion is a ridge that is lengthwise in a direction along an abutment surface onto the supporter,
the supporter includes a rib that protrudes toward the rear member from a surface on a side of the rear member, and is lengthwise in a direction along the surface on the side of the rear member, and
the protruded portion and the rib are disposed to abut on each other in such a manner that a lengthwise direction of the protruded portion and a lengthwise direction of the rib are orthogonal to each other.

5. The assembly structure of an operation unit according to claim 2,
wherein a recessed portion is provided in a position that is adjacent to the protruded portion of the elastic sheet member.

6. The assembly structure of an operation unit according to claim 1,
  wherein a recessed portion in which the elastic member is fitted is included in a position of the supporter where the supporter holds the elastic member.

7. The assembly structure of an operation unit according to claim 1,
  wherein a protruded portion that is fitted in the elastic member is included in a position of the supporter where the supporter holds the elastic member.

* * * * *